(12) United States Patent
Ju et al.

(10) Patent No.: US 10,276,820 B2
(45) Date of Patent: Apr. 30, 2019

(54) QUANTUM DOTS LIGHT EMITTING DIODE AND FABRICATING METHOD THEREOF, DISPLAY PANEL AND DISPLAY APPARATUS

(71) Applicant: BOE TECHNOLOGY GROUP CO., LTD., Beijing (CN)

(72) Inventors: Changcheng Ju, Beijing (CN); Zhuo Chen, Beijing (CN); Wenhai Mei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 86 days.

(21) Appl. No.: 15/565,352

(22) PCT Filed: Nov. 14, 2016

(86) PCT No.: PCT/CN2016/105693
§ 371 (c)(1),
(2) Date: Oct. 9, 2017

(87) PCT Pub. No.: WO2018/086114
PCT Pub. Date: May 17, 2018

(65) Prior Publication Data
US 2018/0309078 A1    Oct. 25, 2018

(51) Int. Cl.
*H01L 51/50* (2006.01)
*H01L 51/52* (2006.01)
*H01L 51/56* (2006.01)

(52) U.S. Cl.
CPC ........ *H01L 51/502* (2013.01); *H01L 51/5056* (2013.01); *H01L 51/5072* (2013.01); *H01L 51/5088* (2013.01); *H01L 51/5203* (2013.01); *H01L 51/56* (2013.01); *H01L 2251/5353* (2013.01)

(58) Field of Classification Search
None
See application file for complete search history.

(56) References Cited

U.S. PATENT DOCUMENTS

| 7,968,792 | B2 | 6/2011 | Harkness, IV et al. |
| 2018/0196164 | A1* | 7/2018 | Friend ...................... G02B 1/02 |
| 2018/0233688 | A1* | 8/2018 | Chen ....................... H01L 51/50 |

FOREIGN PATENT DOCUMENTS

| CN | 105206718 A | 9/2015 |
| CN | 105720204 A | 6/2016 |
| CN | 105870349 A | 8/2016 |

(Continued)

OTHER PUBLICATIONS

First Office Action in the Korean Patent Application No. 20177030762, dated Sep. 15, 2018; English translation attached.

(Continued)

*Primary Examiner* — Thien F Tran
(74) *Attorney, Agent, or Firm* — Intellectual Valley Law, P.C.

(57) ABSTRACT

The present application discloses a method of fabricating a quantum dots light emitting diode, the method including co-depositing an electron transport material and an inorganic perovskite material on a base substrate to form a composite layer having the electron transport material and the inorganic perovskite material.

20 Claims, 6 Drawing Sheets

(56) References Cited

FOREIGN PATENT DOCUMENTS

CN 106098956 A 11/2016
JP 2010056454 A 3/2010

OTHER PUBLICATIONS

International Search Report & Written Opinion dated Aug. 18, 2017, regarding PCT/CN2016/105693.
"Quantum Dot Light-emitting Diodes Based on Inorganic Perovskite Cesium Lead Halides ($CsPbX_3$)", Jizhong Song et al., Advanced materials DOL: 10.1002/ adma.201502567 (2015).
"Tuning Electronic Transport in a Self-Assembled Nanocomposite", Wei Sea Chang et al., ACSNANO, vol. 8, No. 6, 3242-6249, 2014.
"Study on the Integrated Growth and Properties of Pb ($Zr0.52Ti0.48$) O3 Ferroelectric Thin Films and GaN / Al2O3", Li Li, Master Degree Thesis of University of Electronics and Technology, 2010.

\* cited by examiner

US 10,276,820 B2

QUANTUM DOTS LIGHT EMITTING DIODE AND FABRICATING METHOD THEREOF, DISPLAY PANEL AND DISPLAY APPARATUS

CROSS-REFERENCE TO RELATED APPLICATION

This application is a national stage application under 35 U.S.C. § 371 of International Application No. PCT/CN2016/105693, filed Nov. 14, 2016, the contents of which are incorporated by reference in the entirety.

TECHNICAL FIELD

The present invention relates to a quantum dots light emitting diode, a display panel and a display apparatus having the same, and a fabricating method thereof.

BACKGROUND

Quantum dots light emitting diodes typically include a light emitting layer having a plurality of cadmium selenide nanocrystals. The cadmium selenide layer is sandwiched between an electron transport layer and a hole transport layer. An electric field is applied to the quantum dots light emitting diode, causing electrons and holes to move into the cadmium selenide layer. In the cadmium selenide layer, the electrons and holes are trapped in the quantum dots and recombine, emitting photons. The emission spectrum of a quantum dots light emitting diode is narrower as compared to conventional organic light emitting diodes.

SUMMARY

In one aspect, the present invention provides a method of fabricating a quantum dots light emitting diode, comprising co-depositing an electron transport material and an inorganic perovskite material on a base substrate to form a composite layer comprising the electron transport material and the inorganic perovskite material.

Optionally, the inorganic perovskite material comprises $CsPbX_3$, wherein $X_3$ are three halide anions selected from Cl, Br and I, or any combination thereof.

Optionally, the co-depositing is performed by pulsed laser deposition.

Optionally, the method further comprises annealing the composite layer to form a quantum dots light emitting layer comprising a plurality of quantum dots, and an electron transport layer; wherein the inorganic perovskite material self-assembles into the plurality of quantum dots on a surface of the composite layer during annealing.

Optionally, the co-depositing comprises exposing an inorganic perovskite material target and an electron transport material target separately placed in a same pulsed laser deposition chamber to a laser source.

Optionally, a volume ratio of the inorganic perovskite material to the electron transport material in the composite layer is in a range of approximately 1:100 to approximately 1:10.

Optionally, the volume ratio of the inorganic perovskite material to the electron transport material in the composite layer is approximately 5:95.

Optionally, the co-depositing is performed at a deposition temperature in a range of approximately 450 degrees to approximately 700 degrees.

Optionally, the co-depositing is performed in an oxygen atmosphere under a deposition pressure in a range of approximately 50 mtorr to approximately 150 mtorr.

Optionally, the co-depositing is performed at a laser pulse frequency in a range of approximately 5 Hz to approximately 20 Hz; and a laser energy density in a range of approximately 100 $mJ/cm^2$ to about 270 $mJ/cm^2$.

Optionally, the electron transport material comprises an inorganic metal oxide.

Optionally, the inorganic metal oxide is selected from the group consisting of $ZnO$, $TiO_2$, $WO_3$, and $SnO_2$.

Optionally, the annealing is performed for a duration of approximately 10 minutes to 50 minutes.

Optionally, the electron transport layer has a thickness in a range of approximately 10 nm to approximately 100 nm, and the plurality of quantum dots have an average diameter in a range of approximately 2 nm to approximately 20 nm.

Optionally, the method further comprises forming a hole transport layer comprising a hole transport material on a side of the quantum dots light emitting layer distal to the electron transport layer; wherein the hole transport material is selected from the group consisting of 4,4'-cyclohexylidene bis[N,N-bis(4-methylphenyl)benzenamine (TAPC), 4,4',4"-tris(N-carbazolyl)triphphenylamine (TCTA), N,N'-di(1-naphthyl)-N,N'-diphenylbenzidine (NPB), or any combination thereof.

Optionally, the method further comprises forming a hole injection layer comprising a hole injection material on a side of the hole transport layer distal to the quantum dots light emitting layer; wherein the hole injection material is selected from the group consisting of $MoO_3$, CuPc, poly(3,4-ethylenedioxythiophene) polystyrene sulfonate (PEDOT:PSS).

Optionally, the method further comprises forming a first electrode layer on a side of the hole injection layer distal to the hole transport layer; and prior to forming the composite layer, forming a second electrode layer on the base substrate; wherein the second electrode layer is formed on a side of the composite layer proximal to the base substrate.

In another aspect, the present invention provides a quantum dots light emitting diode fabricated by a method described herein.

In another aspect, the present invention provides a display panel comprising a quantum dots light emitting diode described herein.

In another aspect, the present invention provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
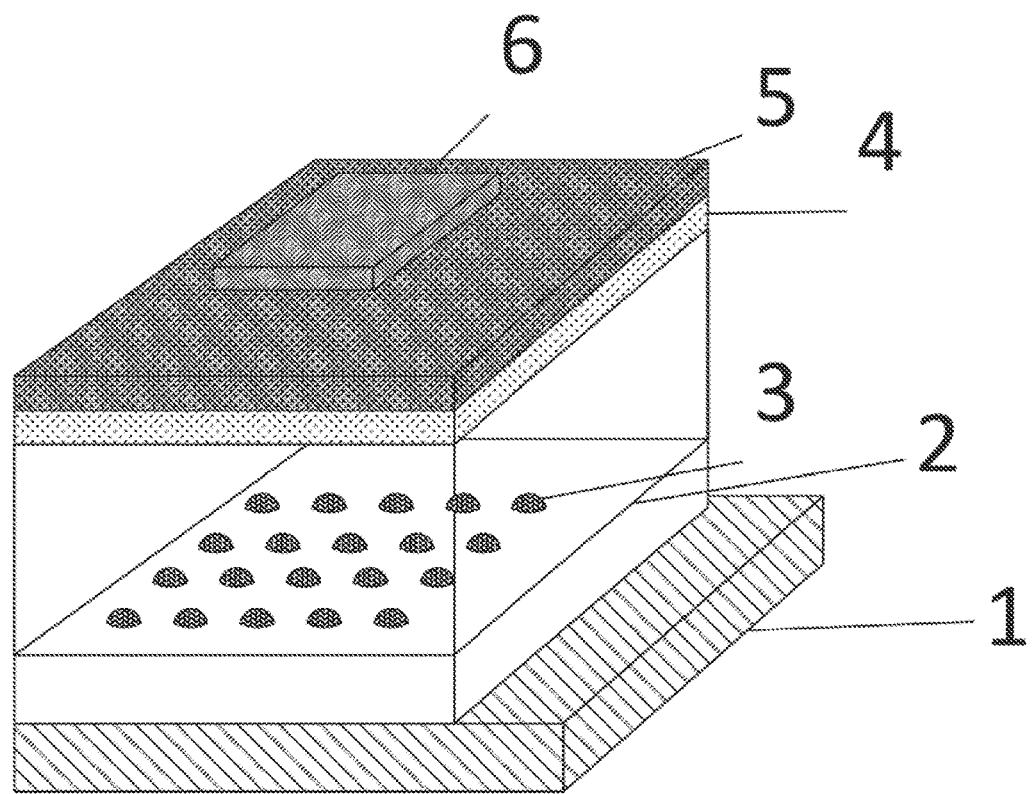
FIG. 1 a diagram illustrating the structure of a quantum dots light emitting diode in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Semiconductor quantum dots have several unique characteristics, including tunable emission wavelength, narrow emission spectrum, and high emission stability, and have been a focus of research and development in recent years. Quantum dots light emitting display panels have the advantages of high luminescent efficiency, a broader color range and a truer color reproduction, and lower energy consumption. Conventional semiconductor quantum dots mainly use a cadmium-based semiconductor material, and have a core-shell structure. Due to high manufacturing costs associated with its material and complex fabricating process, industrial production of semiconductor quantum dots display panel is limited. Organic-inorganic perovskite materials have the characteristics of low costs, high carrier mobility, and high absorption coefficient, and have found application in solar cells. However, due to native defects in these materials, the organic-inorganic perovskite materials have very low fluorescent quantum efficiency (e.g., lower than 20%) and low stability. Moreover, conventional quantum dots structures are typically formed by a hot injection method involving complicated fabricating process and highly toxic intermediate side products, resulting a negative environmental impact and high manufacturing costs.

The possibility of using inorganic perovskite materials for making quantum dots light emitting diode is explored in the present disclosure. It was discovered in the present disclosure that a deposition-based process may be used to fabricate a quantum dots light emitting layer having superior properties. The present process greatly simplifies the fabrication process of the quantum dots light emitting diode and alleviates the impact on the environment. Thus, the present disclosure provides, inter alia, a quantum dots light emitting diode, a display panel and a display apparatus having the same, and a fabricating method thereof that substantially obviate one or more of the problems due to limitations and disadvantages of the related art. In one aspect, the present disclosure provides a quantum dots light emitting diode having a composite layer including an electron transport material and an inorganic perovskite material. In some embodiments, the quantum dots light emitting diode includes an electron transport layer on a base substrate and a quantum dots light emitting layer on a side of the electron transport layer distal to the base substrate. The quantum dots light emitting layer includes the inorganic perovskite material. The electron transport layer includes the electron transport material. Optionally, the electron transport material includes an inorganic metal oxide. Optionally, the inorganic metal oxide is selected from the group consisting of ZnO, $TiO_2$, $WO_3$, and $SnO_2$. Optionally, a volume ratio of the inorganic perovskite material to the electron transport material in the composite layer is in a range of approximately 1:100 to approximately 1:10, e.g., approximately 1:100 to approximately 1:50, approximately 1:50 to approximately 1:25, approximately 1:25 to approximately 3:50, and approximately 3:50 to approximately 1:10. Optionally, the volume ratio of the inorganic perovskite material to the electron transport material in the composite layer is approximately 5:95.

As used herein, the term "inorganic perovskite material" refers to any inorganic material that is capable of having a perovskite type crystal structure (e.g., a same type of crystal structure as calcium titanium oxide). Optionally, the material can exist in a perovskite crystalline phase regardless of whether the material is actually in such phase. Optionally, the inorganic perovskite material has the general stoichiometry $AMX_3$, where "A" and "M" are cations and "X" is an anion. The "A" and "M" cations can have a variety of charges. The anions may be the same or different. Optionally, the perovskite material includes structures having three or four anions, which may be the same or different, and two metal atoms carrying two or three positive charges. Optionally, the inorganic perovskite material comprises $CsPbX_3$, wherein $X_3$ are three halide anions selected, from Cl, Br and I, or any combination thereof.

In some embodiments, the quantum dots light emitting layer includes a plurality of quantum dots on the electron transport layer. FIG. 1 a diagram illustrating the structure of a quantum dots light emitting diode in some embodiments. Referring to FIG. 1, the plurality of quantum dots in the quantum dots light emitting layer 3 are evenly distributed on the surface of the electron transport layer 2. As compared to convention quantum dots light emitting diode made by a hot injection method, the present quantum dots light emitting diode has superior properties. For example, the quantum dots light emitting layer in the present quantum dots light emitting diode are self-assembled on the surface of the electron transport layer by solid-solid phase separation during an annealing process. Thus, the quantum dots have a large contact surface and excellent contact characteristics with the electron transport layer, resulting in a high electron transport efficiency. Optionally, quantum dots have an average diameter in a range of approximately 2 nm to approximately 20 nm, e.g., approximately 5 nm to approximately 10 nm. Optionally, the electron transport layer has a thickness in a range of approximately 10 nm to approximately 100 nm, e.g., approximately 60 nm.

Referring to FIG. 1, the quantum dots light emitting diode in the embodiment further includes a hole transport layer 4 on a side of the quantum dots light emitting layer 3 distal to the electron transport layer 2, a hole injection layer 5 on a side of the hole transport layer 4 distal to the quantum dots light emitting layer 3, a first electrode layer 6 on a side of the hole injection layer 5 distal to the hole transport layer 4, and a second electrode layer 1 on a side of the electron transport layer 2 distal to the quantum dots light emitting layer 3.

Various appropriate hole transport materials may be used to make the hole transport layer. Examples of appropriate hole transport materials include, but are not limited to, 4,4'-cyclohexylidene bis[N,N-bis(4-methylphenyl)benzenamine (TAPC), 4,4',4"-tris(N-carbazolyl)triphenylamine (TCTA), N,N'-di(1-naphthyl)-N,N'-diphenylbenzidine (NPB), or any combination thereof. The hole transport layer may be have any appropriate thickness. Optionally, the hole transport layer is made of TCTA and has a thickness in a range of approximately 5 nm to approximately 20 nm, e.g., approximately 10 nm. Optionally, the hole transport layer is made of TAPC and has a thickness in a range of approximately 20 nm to approximately 100 nm, e.g., approximately 50 nm. Optionally, the hole transport layer is a laminated layer including a TAPC sub-layer and a TCTA sub-layer, in which the TAPC sub-layer has a thickness in a range of approximately 20 nm to approximately 80 nm, e.g., approximately 40 nm, and the TCTA sub-layer has a thickness in a range of approximately 5 nm to approximately 20 nm, e.g., approximately 10 nm. Optionally, the hole transport layer is made of NPB and has a thickness in a range of approximately 20 nm to approximately 100 nm, e.g., approximately 50 nm. Optionally, the hole transport layer is a laminated layer including a NPB sub-layer and a TCTA sub-layer, in which the NPB sub-layer has a thickness in a range of approximately 20 nm to approximately 80 nm, e.g., approximately 40 nm, and the TCTA sub-layer has a thickness in a range of approximately 5 nm to approximately 20 nm, e.g., approximately 10 nm. Optionally, the hole transport layer is made of PVK and has a thickness in a range of approximately 10 nm to approximately 60 nm, e.g., approximately 30 nm.

Various appropriate hole injection materials may be used to make the hole injection layer. Examples of appropriate hole injection materials include, but are not limited to, $MoO_3$, CuPc, poly(3,4-ethylenedioxythiophene)polystyrene sulfonate (PEDOT:PSS). The hole injection layer may have any appropriate thickness. Optionally, the hole injection layer is made of $MoO_3$ and has a thickness in a range of approximately 20 nm to approximately 80 nm, e.g., approximately 40 nm.

Various appropriate electrode materials may be used to make the first electrode layer and the second electrode layer. Examples of appropriate electrode materials include, but are not limited to, indium tin oxide, lithium fluoride, and aluminum. The electrodes may be of any appropriate thickness. Optionally, the electrode layer is made of lithium fluoride and has a thickness in a range of approximately 0.5 nm to approximately 2 nm, e.g., approximately 1 nm. Optionally, the electrode layer is made of aluminum and has a thickness in a range of approximately 20 nm to approximately 200 nm, e.g., approximately 100 nm. Optionally, the electrode layer is made of indium tin oxide and has a thickness in a range of approximately 40 nm to approximately 150 nm, e.g., approximately 70 nm.

The present quantum dots light emitting diode may be made by a novel method for achieving its superior properties. In some embodiments, the quantum dots light emitting diode is fabricated by a method having a step of co-depositing an electron transport material and an inorganic perovskite material on a base substrate to form a composite layer including the electron transport material and the inorganic perovskite material.

Various appropriate deposition methods may be used for co-depositing the electron transport material and the inorganic perovskite material. Examples of appropriate deposition methods include, but are not limited to, pulsed laser deposition, electron beam deposition, cathodic arc deposition, and the like.

Figure 2:
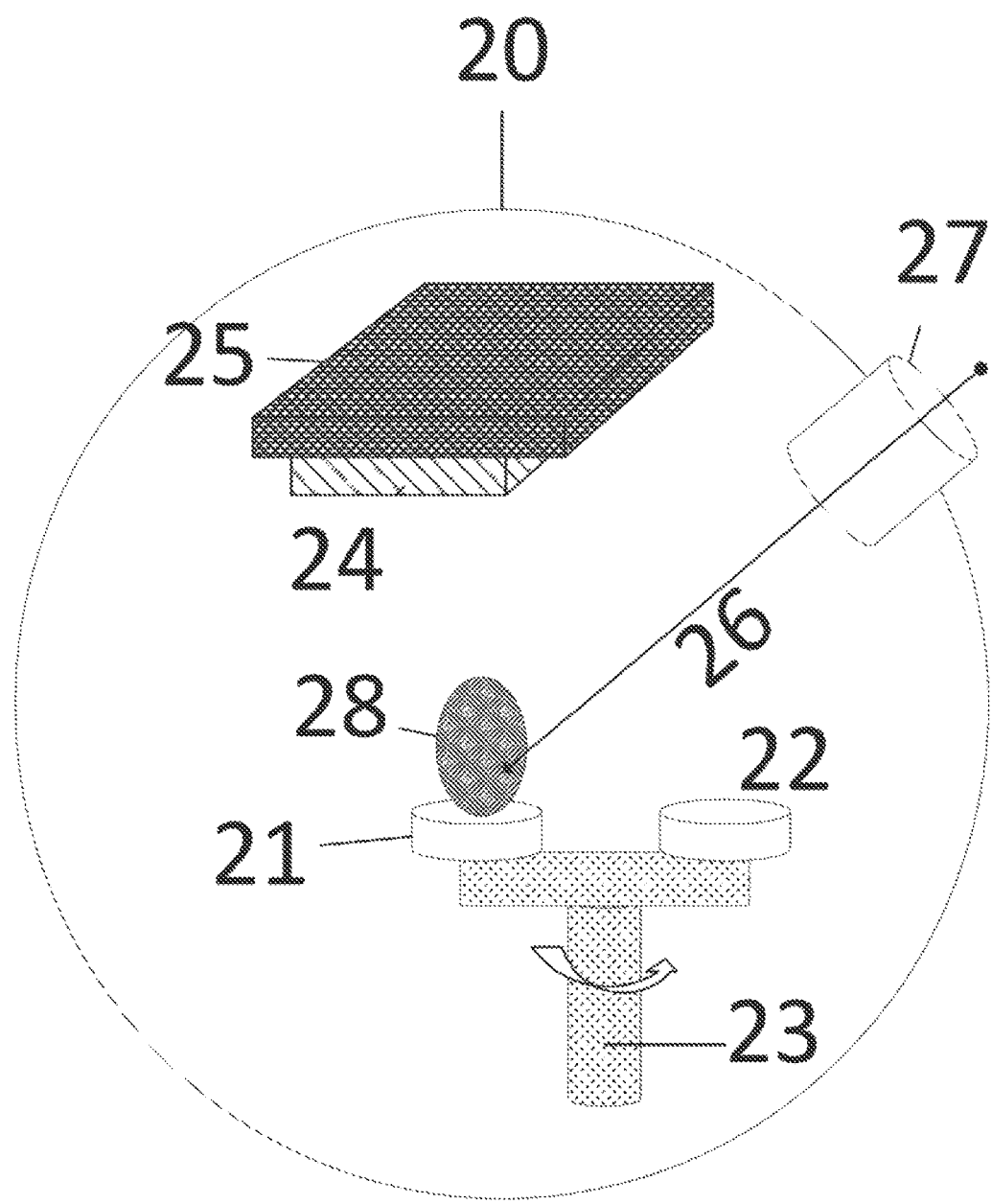
FIG. 2 is a diagram illustrating an exemplary pulsed laser deposition process in some embodiments.

FIG. 2 is a diagram illustrating an exemplary pulsed laser deposition process in some embodiments. Referring to FIG. 2, the pulsed laser deposition device includes a vacuum chamber 20, in which an inorganic perovskite material target 21 (e.g., a $CsPbX_3$ target) and an electron transport material target 22 (e.g., a ZnO target) is separately placed on a rotary bearing 23. A base substrate 24 (e.g., a base substrate having an indium tin oxide electrode layer formed on the base substrate 24) is also placed on a heating stage 25 in the vacuum chamber 20. An incident pulsed laser beam 26 is introduced into the vacuum chamber 20 through a laser window 27. The inorganic perovskite material target 21 and the electron transport material target 22 are exposed to the incident pulsed laser beam 26. When the target is exposed to the laser beam, the target is ionized and ejected as a plasma plume 28. As the plasma plume 28 reaches the base substrate 24, the target material is deposited on the base substrate 24.

As shown in FIG. 2, the inorganic perovskite material target 21 and the electron transport material target 22 are placed on the rotary bearing 23 so that two targets may be exposed to the laser beam for different exposure durations. In some embodiments, provided that deposition rates of the inorganic perovskite material target and the electron transport material target are maintained substantially the same, a ratio of exposure duration for the inorganic perovskite material target to exposure duration for the electron transport material target may be set in a range of approximately 1:100 to approximately 1:10, e.g., approximately 1:100 to approximately 1:50, approximately 1:50 to approximately 1:25, approximately 1:25 to approximately 3:50, and approximately 3:50 to approximately 1:10. The deposition rates of the inorganic perovskite material target and the electron transport material target can be maintained by, e.g., adjusting laser pulse frequency or laser energy density applied to the targets. Optionally, the ratio of exposure duration for the inorganic perovskite material target to exposure duration for the electron transport material target is approximately 5:95 while the deposition rates of the inorganic perovskite material target and the electron transport material target are maintained substantially the same. Different exposure durations for the inorganic perovskite material target and the electron transport material target result in different percentages (e.g., volume percentages or weight percentages) of the inorganic perovskite material and the electron transport material in the composite layer formed on the base substrate 24. Numerous alternative embodiments may be practiced to achieve different exposure durations for different targets, with or without a rotary bearing 23.

Various deposition parameters may be adjusted to achieve a certain thickness of the composite layer and the volume ratio of the two targets. These parameters include, for example, deposition, temperature, deposition, pressure, laser pulse frequency, laser energy density, deposition duration, and the like. Optionally, the co-depositing is performed at a deposition temperature in a range of approximately 300 degrees to approximately 700 degrees, e.g., approximately 450 degrees to approximately 700 degrees, approximately 500 degrees. Optionally, the co-depositing is performed in an oxygen atmosphere under a deposition pressure in a range of approximately 50 mtorr to approximately 150 mtorr, e.g., approximately 100 mtorr. Optionally, the co-depositing is performed at a laser pulse frequency in a range of approximately 5 Hz to approximately 20 Hz (e.g., approximately 10 Hz); and a laser energy density m a range of approximately 100 $mJ/cm^2$ to about 270 $mJ/cm^2$ (e.g., approximately 260 $mJ/cm^2$). Optionally, the co-depositing is performed for a deposition duration in a range of approximately 5 minutes to approximately 40 minutes, e.g., approximately 20 minutes.

Various appropriate target materials may be used for making the composite layer. In some embodiments, the inorganic perovskite material target includes $CsPbX_3$, wherein X, are three halide anions selected from Cl, Br and I, or any combination thereof. In some embodiments, the electron transport material target includes an inorganic metal oxide, such as ZnO, $TiO_2$, $WO_3$, and $SnO_2$. The target material may be a single crystal material or a ceramic material.

Figure 3:
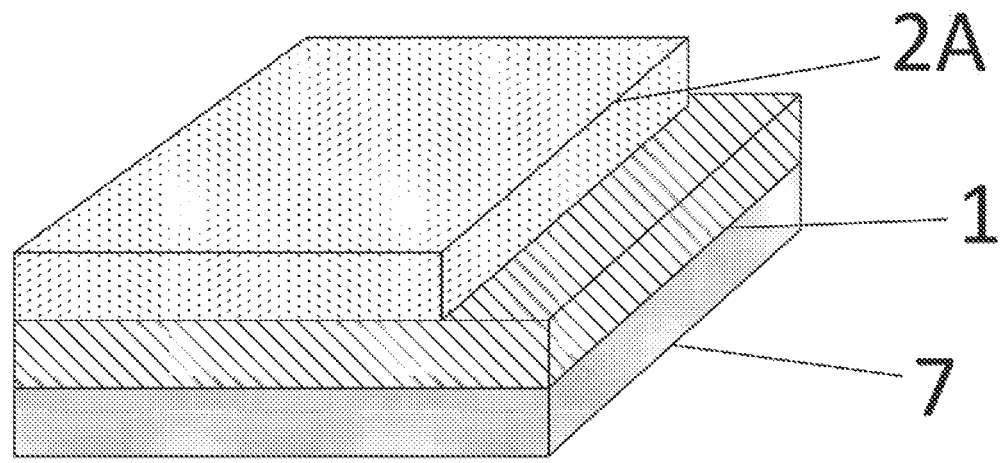
FIGS. 3-7 illustrate a fabricating process for making a quantum dots light emitting diode in some embodiments.

FIGS. 3-7 illustrate a fabricating process for making a quantum dots light emitting diode in some embodiments. Referring to FIG. 3, an electron transport material and an inorganic perovskite material are co-deposited on a base substrate 7 (having a second electrode layer 1 pre-deposited) to form a composite layer 2A. The deposition may be performed by a pulsed laser deposition process as described above. Optionally, a volume ratio of the inorganic perovskite material to the electron transport material in the composite layer so formed is in a range of approximately 1:100 to approximately 1:10, e.g., approximately 1:100 to approximately 1:50, approximately 1:50 to approximately 1:25, approximately 1:25 to approximately 3:50, and approximately 3:50 to approximately 1:10. Optionally, the volume ratio of the inorganic perovskite material target to the electron transport material in the composite layer so formed is approximately 5:95. Optionally, a thickness of the composite layer may be in a range of approximately 10 nm to approximately 100 nm, e.g., approximately 60 nm.

Figure 4:
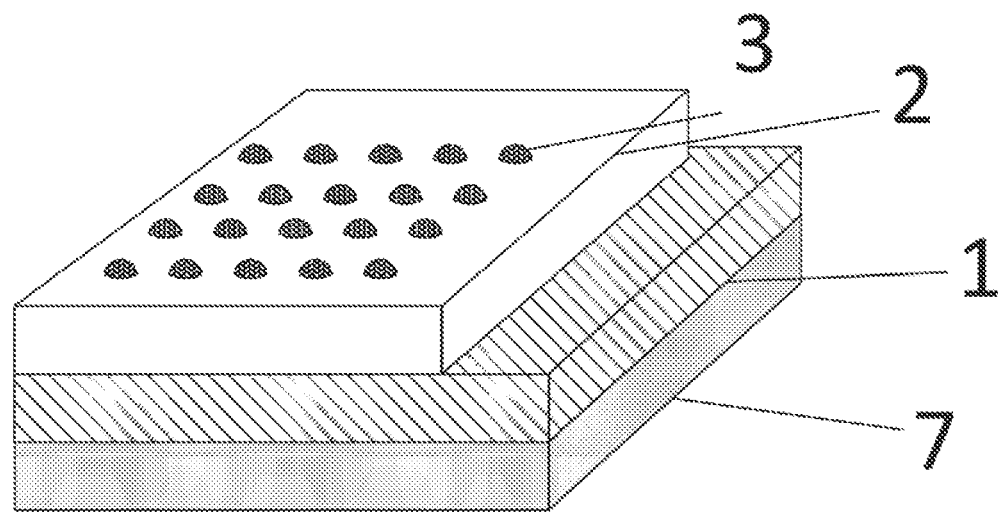

Referring to FIG. 4, the method in the embodiment further includes annealing the composite layer 2A to form a quantum dots light emitting layer 3 having a plurality of quantum dots on a side of an electron transport layer 2 distal to the second electrode layer 1. During the annealing process, phase separation occurs between the inorganic perovskite material and the electron transport material due to their different crystal lattice energies and unfavorable free energy of mixing the two crystals. As a result, the inorganic perovskite material in the composite layer 2A self-assembles into the plurality of quantum dots on a surface of the composite layer 2A, e.g., through a solid-solid phase separation process. The quantum dots in the quantum dots light emitting layer 3 so formed have a large contact surface and excellent contact characteristics with the electron transport layer 2, resulting in a high electron transport efficiency. Optionally, quantum dots so formed have an average diameter in a range of approximately 2 nm to approximately 20 nm, e.g., approximately 5 nm to approximately 10 nm. Optionally, the electron transport layer so formed has a thickness in a range of approximately 10 nm to approximately 100 nm, e.g., approximately 60 nm.

Various appropriate annealing parameters may be practiced to achieve a certain characteristic of the quantum dots light emitting layer and the electron transport layer. Optionally, the annealing is performed at an annealing temperature in a range of approximately 300 degrees to approximately 500 degrees, e.g., approximately 400 degrees. Optionally, the annealing is performed for a duration of approximately 10 minutes to approximately 50 minutes, e.g., approximately 30 minutes. Optionally, the annealing is performed under an oxygen atmosphere.

Figure 5:
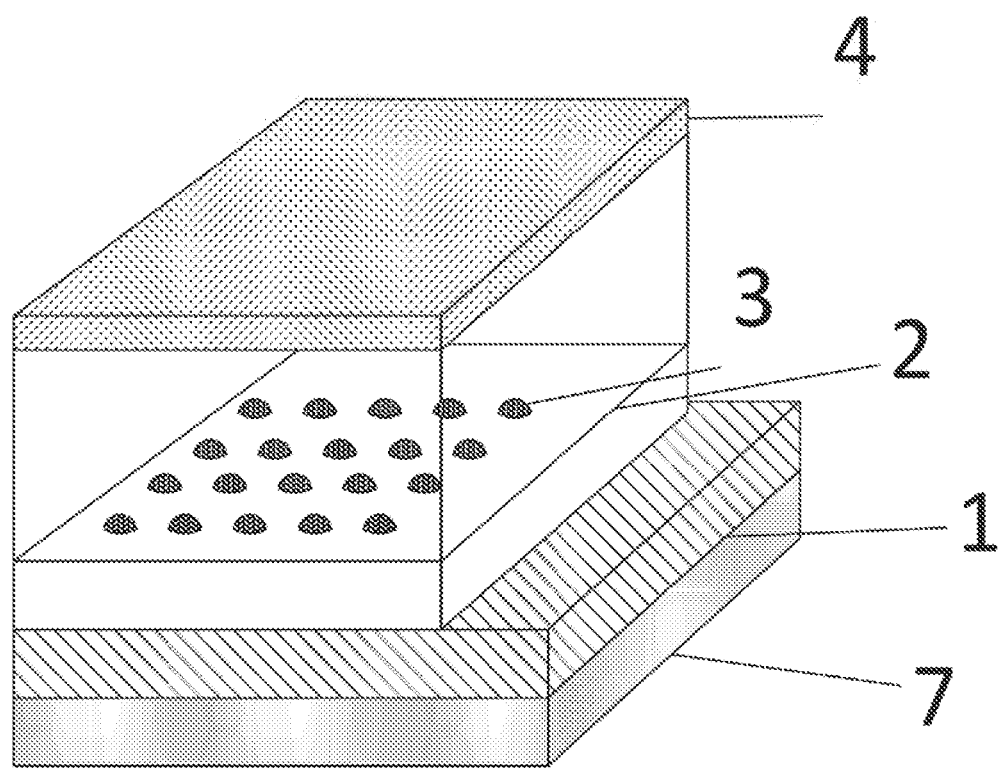

Referring to FIG. 5, the method in the embodiment further includes forming a hole transport layer 4 having a hole transport material on a side of the quantum dots light emitting layer 3 distal to the electron transport layer 2. Various appropriate hole transport materials may be used to make the hole transport layer. Examples of appropriate hole transport materials include, but are not limited to, 4,4'-cyclohexylidene bis[N,N-bis(4-methylphenyl)benzenamine (TAPC), 4,4',4"-tris(N-carbazolyl)triphenylamine (TCTA), N,N'-di(1-naphthyl)-N,N'-diphenylbenzidine (NPB), or any combination thereof.

Figure 6:
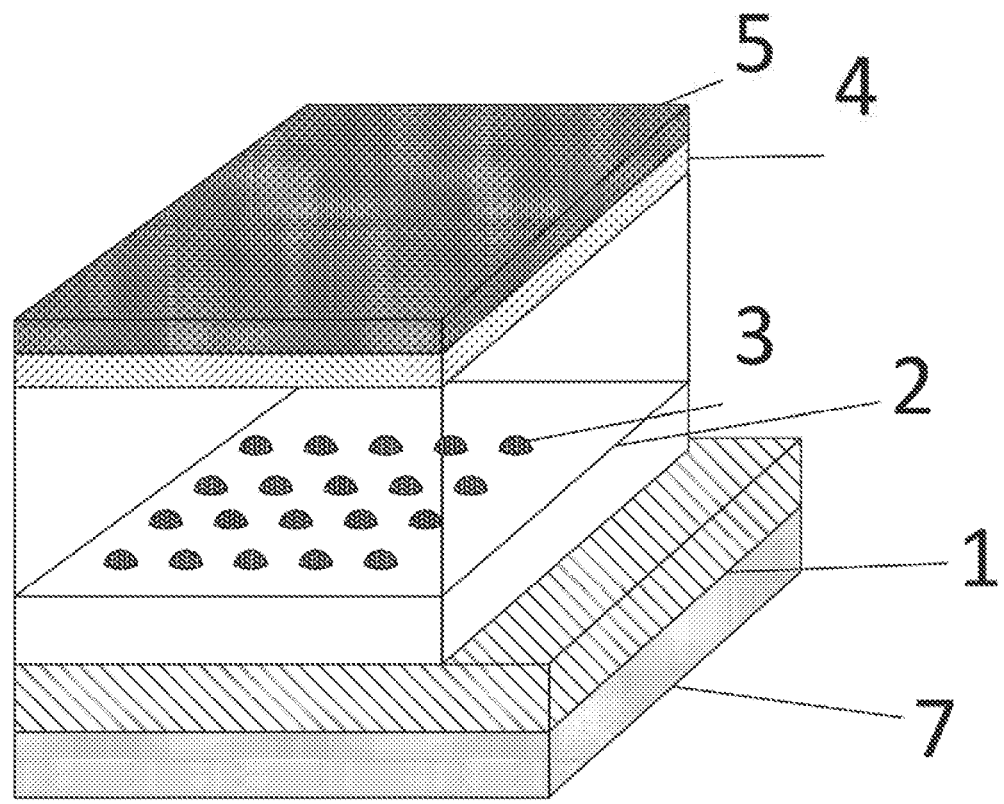

Referring to FIG. 6, the method in the embodiment further includes forming a hole injection layer 5 having a hole injection material on a side of the hole transport layer 4 distal to the quantum dots light emitting layer 3. Various appropriate hole injection materials may be used to make the hole injection layer. Examples of appropriate hole injection materials include, but are not limited to, $MoO_3$, CuPc, poly(3,4-ethylenedioxythiophene) polystyrene sulfonate (PEDOT:PSS).

Figure 7:
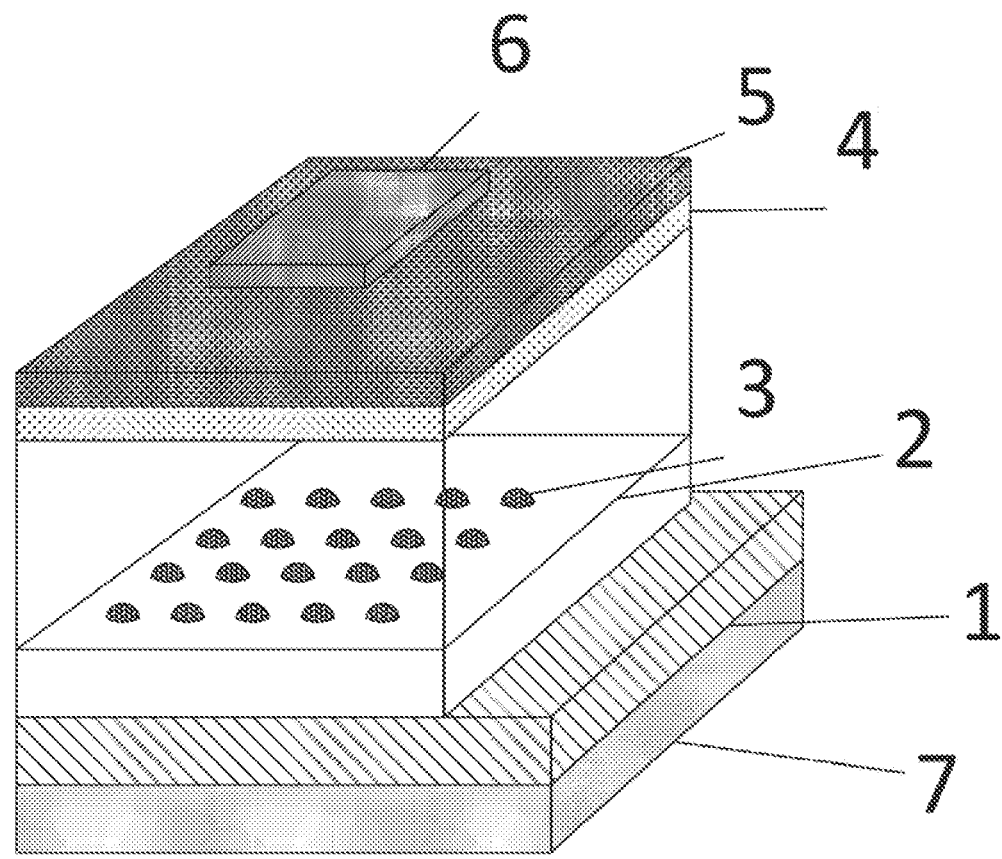

Referring to FIG. 7, the method in the embodiment further includes forming a first electrode layer 6 on a side of the hole injection layer 5 distal to the hole transport layer 4. In some embodiments, prior to forming the composite layer 2A, the method further includes forming a second electrode layer 1 on the base substrate 7. The second electrode layer 1 is formed on a side of the composite layer 2A proximal to the base substrate 7. Various appropriate electrode materials may be used to make the first electrode layer and the second electrode layer. Examples of appropriate electrode materials include, but are not limited to, indium tin oxide, lithium fluoride, and aluminum.

In another aspect, the present disclosure provides a quantum dots light emitting diode fabricated by a method described herein. In another aspect, the present disclosure provides a display panel having a quantum dots light emitting diode described herein or fabricated by a method described herein. In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a quantum dots light emitting diode, comprising co-depositing an electron transport material and an inorganic perovskite material on a base substrate to form a composite layer comprising the electron transport material and the inorganic perovskite material.

2. The method of claim 1, wherein the inorganic perovskite material comprises $CsPbX_3$, wherein $X_3$ are three halide anions selected from Cl, Br and I, or any combination thereof.

3. The method of claim 1, wherein the co-depositing is performed by pulsed laser deposition.

4. The method of claim 3, wherein the co-depositing comprises exposing an inorganic perovskite material target and an electron transport material target separately placed in a same pulsed laser deposition chamber to a laser source.

5. The method of claim 4, wherein a volume ratio of the inorganic perovskite material to the electron transport material in the composite layer is in a range of approximately 1:100 to approximately 1:10.

6. The method of claim 4, wherein the volume ratio of the inorganic perovskite material to the electron transport material in the composite layer is approximately 5:95.

7. The method of claim 4, wherein the co-depositing is performed at a deposition temperature in a range of approximately 450 degrees to approximately 700 degrees.

8. The method of claim 4, wherein the co-depositing is performed in an oxygen atmosphere under a deposition pressure in a range of approximately 50 mtorr to approximately 150 mtorr.

9. The method of claim 4, wherein the co-depositing is performed at a laser pulse frequency in a range of approximately 5 Hz to approximately 20 Hz;

and a laser energy density in a range of approximately 100 mJ/cm$^2$ to about 270 mJ/cm$^2$.

10. The method of claim 1, further comprising annealing the composite layer to form a quantum dots light emitting layer comprising a plurality of quantum dots, and an electron transport layer; wherein the inorganic perovskite material self-assembles into the plurality of quantum dots on a surface of the composite layer during annealing.

11. The method of claim 10, wherein the annealing is performed for a duration of approximately 10 minutes to 50 minutes.

12. The method of claim 10, wherein the electron transport layer has a thickness in a range of approximately 10 nm to approximately 100 nm, and the plurality of quantum dots have an average diameter in a range of approximately 2 nm to approximately 20 nm.

13. The method of claim 10, further comprising forming a hole transport layer comprising a hole transport material on a side of the quantum dots light emitting layer distal to the electron transport layer; wherein the hole transport material is selected from the group consisting of 4,4'-cyclohexylidene bis[N,N-bis(4-methylphenyl)benzenamine (TAPC), 4,4',4"-tris(N-carbazolyl)triphenylamine (TCTA), N,N'-di(1-naphthyl)-N,N'-diphenylbenzidine (NPB), or any combination thereof.

14. The method of claim 13, further comprising forming a hole injection layer comprising a hole injection material on a side of the hole transport layer distal to the quantum dots light emitting layer; wherein the hole injection material is selected from the group consisting of MoO$_3$, CuPc, poly(3,4-ethylenedioxythiophene) polystyrene sulfonate (PEDOT:PSS).

15. The method of claim 14, further comprising:
forming a first electrode layer on a side of the hole injection layer distal to the hole transport layer; and
prior to forming the composite layer, forming a second electrode layer on the base substrate; wherein the second electrode layer is formed on a side of the composite layer proximal to the base substrate.

16. The method of claim 1, wherein the electron transport material comprises an inorganic metal oxide.

17. The method of claim 16, wherein the inorganic metal oxide is selected from the group consisting of ZnO, TiO$_2$, WO$_3$, and SnO$_2$.

18. A quantum dots light emitting diode, fabricated by a method of claim 1.

19. A display panel, comprising a quantum dots light emitting diode of claim 18.

20. A display apparatus, comprising a display panel of claim 19.

* * * * *